US006366769B1

(12) United States Patent
Vaucher et al.

(10) Patent No.: US 6,366,769 B1
(45) Date of Patent: Apr. 2, 2002

(54) FREQUENCY SNYTHESIZER WITH A DIGITAL FREQUENCY WINDOW DETECTOR AND A RECEIVER INCORPORATING THE SAME

(75) Inventors: Cicero S. Vaucher, Eindhoven; Wolfdietrich G. Kasperkovitz, Waalre, both of (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/419,670

(22) Filed: Oct. 15, 1999

(30) Foreign Application Priority Data

Oct. 22, 1998 (EP) .............................................. 98203565

(51) Int. Cl.[7] .............................. H04B 7/00; H04B 1/18
(52) U.S. Cl. ................. 455/260; 455/183.1; 455/192.2; 455/76
(58) Field of Search ............................. 455/260, 183.1, 455/76, 75, 257, 343, 574, 192.2; 370/311; 340/825.44

(56) References Cited

U.S. PATENT DOCUMENTS

| 4,084,127 A | 4/1978 | Tults | 455/180.2 |
| 4,484,221 A | * 11/1984 | Tults | 455/180.2 |
| 4,787,097 A | 11/1988 | Rizzo | 375/375 |
| 4,944,025 A | 7/1990 | Gehring et al. | 455/207 |
| 5,446,411 A | 8/1995 | Horsefall et al. | 329/325 |
| 5,748,046 A | 5/1998 | Badger | 455/260 |

FOREIGN PATENT DOCUMENTS

EP 0278079 8/1988 ............. H03L/7/10

OTHER PUBLICATIONS

Fast Settling PLL Frequency Synthesizer Utilizing the Frequency Detector Method Speedup Circuit–Yasuaki Sumi Tottori Sanyo Electric Co., Ltd., IEEE Transactions on Consumer Electronics, vol.43, No.3 Aug. 1997.

* cited by examiner

Primary Examiner—William Trost
Assistant Examiner—Rafael Perez-Gutierrez

(57) ABSTRACT

Frequency synthesizers are used for down conversion of RF signals in a lot of applications, such as digital and analog radio and television receivers, car radios, etc. By combining the voltage-controlled oscillator of the phase-locked loop demodulator with the voltage-controlled oscillator of the frequency synthesizer, a major cost reduction can be achieved, but measures have to be taken to prevent that the two PLLs try to lock the same VCO to different frequencies. These measures include providing a switching circuit between the phase frequency comparator and the charging circuit, and controlling the switching circuit by using a frequency window detector.

2 Claims, 5 Drawing Sheets

FREQUENCY SNYTHESIZER WITH A DIGITAL FREQUENCY WINDOW DETECTOR AND A RECEIVER INCORPORATING THE SAME

BACKGROUND OF THE INVENTION

1. Field of the Invention

The invention relates to a frequency synthesizer comprising a first input for receiving a first frequency signal and a second input for receiving a second frequency signal, a comparator coupled to the first and second inputs for comparing the first and second signals, and charging means having an input coupled to an output of said comparator, and an output coupled to an output of the frequency synthesizer for supplying an output signal.

The invention further relates to a receiver comprising such a frequency synthesizer.

2. Description of the Related Art

Such frequency synthesizers are known and can be used for down conversion of RF signals in a digital or analog satellite receiver, car radios, digital or analog (cable) TV receivers, cordless or wireless telephones, etc.

By combining the voltage-controlled oscillator of the phase-locked loop demodulator with the voltage-controlled oscillator of the frequency synthesizer, a major cost reduction can be achieved in systems wherein direct demodulation of FM signals is employed.

Such a receiver is, for example, known from U.S. Pat. No. 5,446,411, wherein a phase-locked loop is used as an FM demodulator. The frequency synthesizer is used to set up the phase-locked loop demodulator to run at a predetermined frequency. A standard PLL frequency synthesizer is not suitable in systems were the tuning voltage-controlled oscillator is used for demodulation.

The reason is that two PLLs, the frequency synthesizer and the demodulation loop (FM) or the synchronization loop (AM), will try to lock the same VCO to different frequencies (the former to the multiplied crystal, and the latter to the carrier frequency), which leads to a non-functional system. To overcome the is disadvantages mentioned above, the output of the frequency synthesizer is coupled, via switching means and a resistive divider, to the input of the voltage-controlled oscillator.

Disadvantages of this frequency synthesizer is that the switching means at the output of the frequency synthesizer can cause transients, loss of lock, and spikes during switching. Further, such a resistive divider has thermal noise. Power dissipation is high due to the presence of a frequency measurement device operating at the highest frequency.

SUMMARY OF THE INVENTION

An object of the invention is to overcome the disadvantages of the prior art and further to provide a frequency synthesizer with lower costs, lower dissipation, lower noise, and with an improved performance and wider application range.

To this end a first aspect of the invention provides a frequency synthesizer as described in the opening paragraph, characterized in that the frequency synthesizer further comprises a frequency window detector also coupled to the first and second inputs, said frequency window detector supplying an output signal depending on whether or not the first and second frequency signals are within a predetermined frequency window, and switching means coupled between the comparator and the charging means, said switching means being controlled by the output signal of the frequency window detector. A second aspect of the invention provides a receiver incorporating such frequency synthesizer.

The invention is-based on the recognition that by using a frequency window detector and switching means between the comparator and the charging means, the frequency synthesizer can be turned off. There are two ways to implement this. Firstly, its effect is zero, but the circuitry stays active (watch dog function), and secondly, completely "turn off" (low power dissipation). In this way, the influence of the frequency synthesizer during normal operation, that is, within the frequency window, is reduced to (nearly) zero. Because the switching means is turned off before the charging means, at the moment when the charging means becomes inactive, no transients or spikes can occur at the output of the frequency synthesizer.

A further advantage of the frequency synthesizer according to the invention is that the accuracy of the frequency of the output signal is not dependent on the accuracy of the reference frequency.

This receiver structure, with the combined tuning system, enables the use of cheap crystal oscillators because when the voltage-controlled oscillator is "in-window", the frequency synthesizer is disabled. Therefore, the accuracy of the VCO frequency is not dependent on the accuracy of the crystal frequency, but on the Automatic Frequency Control (AFC). Another advantage is that the AFC has taken over control of the VCO, saving a substantial amount of power dissipation when switching off the power of the frequency synthesizer.

It is to be noted here that from U.S. Pat. No. 4,787,097, a phase-locked loop having a phase detector and a frequency detector, with associated monitor and recovery circuitry, is known for data and clock extraction from NRZ (Non Return to Zero) data streams. After detecting that the phase-locked loop is outside a narrow frequency window, the phase detector is turned off and the frequency detector is turned on. After determining that the phase-locked loop is (again) within the narrow frequency window, the phase detector is turned on and the frequency detector is turned off. Further, this phase-locked loop comprises an EXOR (exclusive OR) and analog elements to obtain a first input signal for the phase-frequency comparator.

The frequency synthesizer of the invention contains no analog elements and is therefore robust with relation to aging, spread in component values, etc.

An embodiment of a frequency synthesizer according to the invention is characterized in that the frequency synthesizer comprises a first divider for dividing the first frequency input signal by a first predetermined value, and a second divider for dividing the second frequency input signal by a second predetermined value.

The division values of the dividers can be chosen depending on the input signals and/or on the crystal oscillator used.

Another embodiment of a frequency synthesizer according to the invention is characterized in that the frequency window detector comprises a logic circuit having inputs coupled, respectively, to the first and the second inputs of the frequency synthesizer, and an output, a phase-frequency detector for supplying a frequency,.difference signal, said phase-frequency detector having a first input coupled to the output of the logic circuit, a second input and an output, and a programmable divider having an input coupled to the second input of the frequency synthesizer, and an output coupled to the second input of the phase-frequency detector, said phase-frequency detector supplying an output signal depending on a frequency difference between the first and second frequency signals as a control signal to the switching means.

In this way, the switching signal for the switching means is obtained very efficiently.

A further embodiment of a frequency synthesizer according to the invention is characterized in that the logic circuit comprises a first D-Flip-Flop having inputs coupled, respectively, to the first and second inputs of the frequency synthesizer, and an output, a multiplexer having a first input coupled to the output of the first D-Flip-Flop, a second input, a select input, and an output, a second D-Flip-Flop having a first input coupled to the first input of the frequency synthesizer, a second input, and an output, an OR-gate having a first input coupled to the second input of the frequency synthesizer, a second input coupled to receive a clock signal, and an output coupled to the second input of the second D-Flip-Flop, an EXOR-gate having a first input coupled to the output of the second D-Flip-Flop, a second input coupled to the output of the first D-Flip-Flop, and an output coupled to the select input of the multiplexer, and a third D-Flip-Flop having a first input coupled to the output of the multiplexer, a second input coupled to the second input of the frequency synthesizer, and an output coupled to the second input of the multiplexer and to the phase-frequency detector.

To further improve the switching signal, the logic circuit of the frequency window detector comprises three D-Flip-Flops to overcome possible unwanted (extra) switching signals.

BRIEF DESCRIPTION OF THE DRAWINGS

The invention and additional features, which may optionally be used to implement the invention to advantage, will be apparent from and elucidated with reference to the examples described below hereinafter and shown in the figures, in which.

Throughout the description, corresponding elements will have corresponding reference numerals.

DESCRIPTION OF THE PREFERRED EMBODIMENTS

Figure 1:
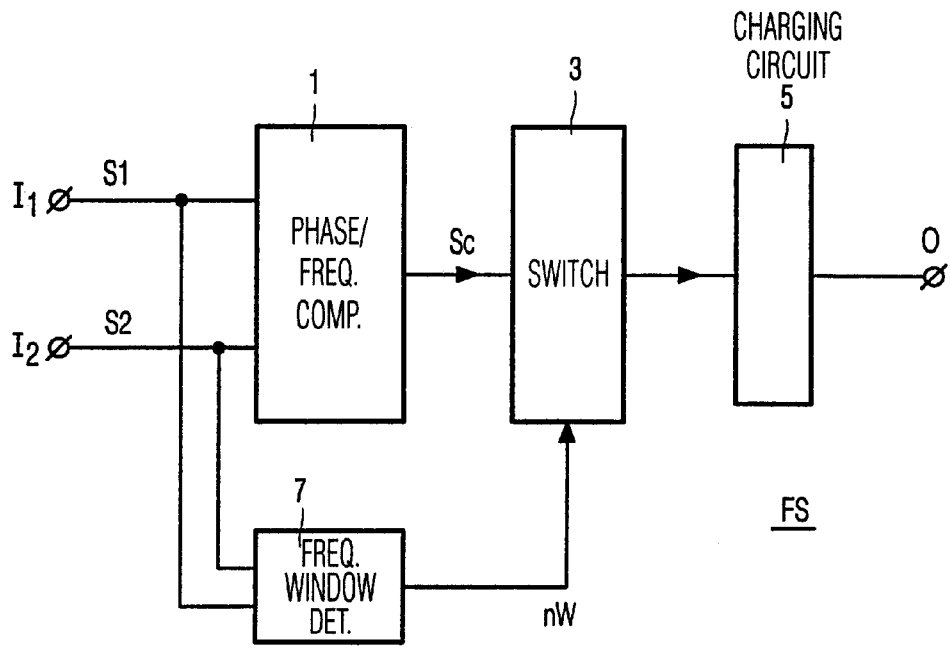
FIG. 1 shows a block schematic example of a frequency synthesizer according to the invention.

FIG. 1 shows an example of a frequency synthesizer FS according to the invention, comprising a first input I1 and a second input I2 for receiving a first frequency input signal s1 and a second frequency input signal s2, respectively. The inputs I1 and I2 are coupled to a phase-frequency comparator 1 for comparing the two frequency input signals. Depending on the frequency difference between the two frequency input signals s1 and s2, the phase-frequency comparator supplies, in operation, a signal sc. The output of the phase-frequency comparator 1 is coupled, via switching means 3, to charging means 5. The charging means 5 supplies a charging signal, for example, via a loop filter, to control a voltage-controlled oscillator (not shown). The two inputs I1 and I2 are also coupled to a frequency window detector 7 for detecting whether or not the two frequency input signals si and s2 are within a predetermined window. Depending on the frequency difference between the two frequency input signals, the frequency window detector 7 supplies a control signal nW to the switching means 3 for opening or closing, respectively, the signal path between the phase-frequency comparator 1 and the charging means 5. When the two frequency input signals are within a predetermined frequency window, the signal path will be opened resulting in no output signal at the output O.

Figure 2:
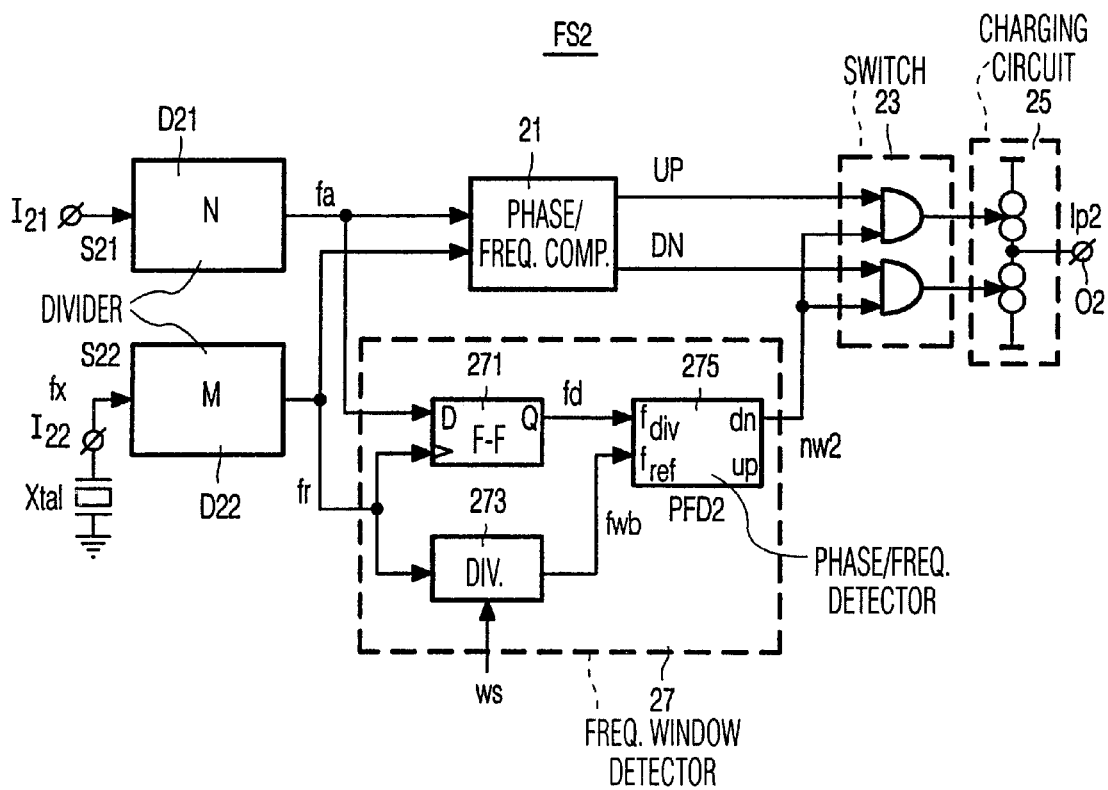
FIG. 2 shows a block schematic example of a frequency synthesizer in more-detail according to the invention.

FIG. 2 shows an example of a frequency synthesizer FS2 according to the invention in more detail. At an input I21, the frequency synthesizer receives the frequency input signal s21, being, in this example, the VCO frequency signal. After dividing this input signal in a divider D21 by a predetermined factor N, the output signal fa of the divider D21 is supplied to a phase-frequency comparator 21. At an input I22, the frequency synthesizer receives a frequency input signal s22 from a crystal oscillator Xtal. After dividing this input signal in a divider D22 by a predetermined factor M, the output signal fr of the divider D22 is supplied to the other input of the phase-frequency comparator 21. The outputs of the dividers D21 and D22, respectively, are also coupled to a frequency window detector 27. The frequency window detector 27 comprises, in this example, a D-Flip-Flop 271, a programmable divider 273 and, a phase-frequency detector 275. The programmable divider 273 receives a signal ws depending on the required window size. The D-Flip-Flop 271 supplies a frequency signal fd which is equal to |fa-fr|. The divider 273 supplies a signal fwb whose frequency defines the size of the frequency window. These two signals are supplied to the phase-frequency detector 275 for supplying an enable-signal nw to the switching means 23 when the frequency of the signal fd is larger than the frequency window. In this example, the switching means 23 is implemented as two AND-stages. The enable signal nw2 is supplied to one input of each AND-gate, and the other inputs receive, respectively, a signal UP or a signal DN from the phase-frequency comparator 21, depending on the frequency or phase difference between the signals fa and fr. The outputs of the AND-gates are coupled to respective current sources, as part of the charging means 25, for supplying a positive or negative current signal Ip2, respectively, at the output O2 of the frequency synthesizer FS2.

Figure 3:
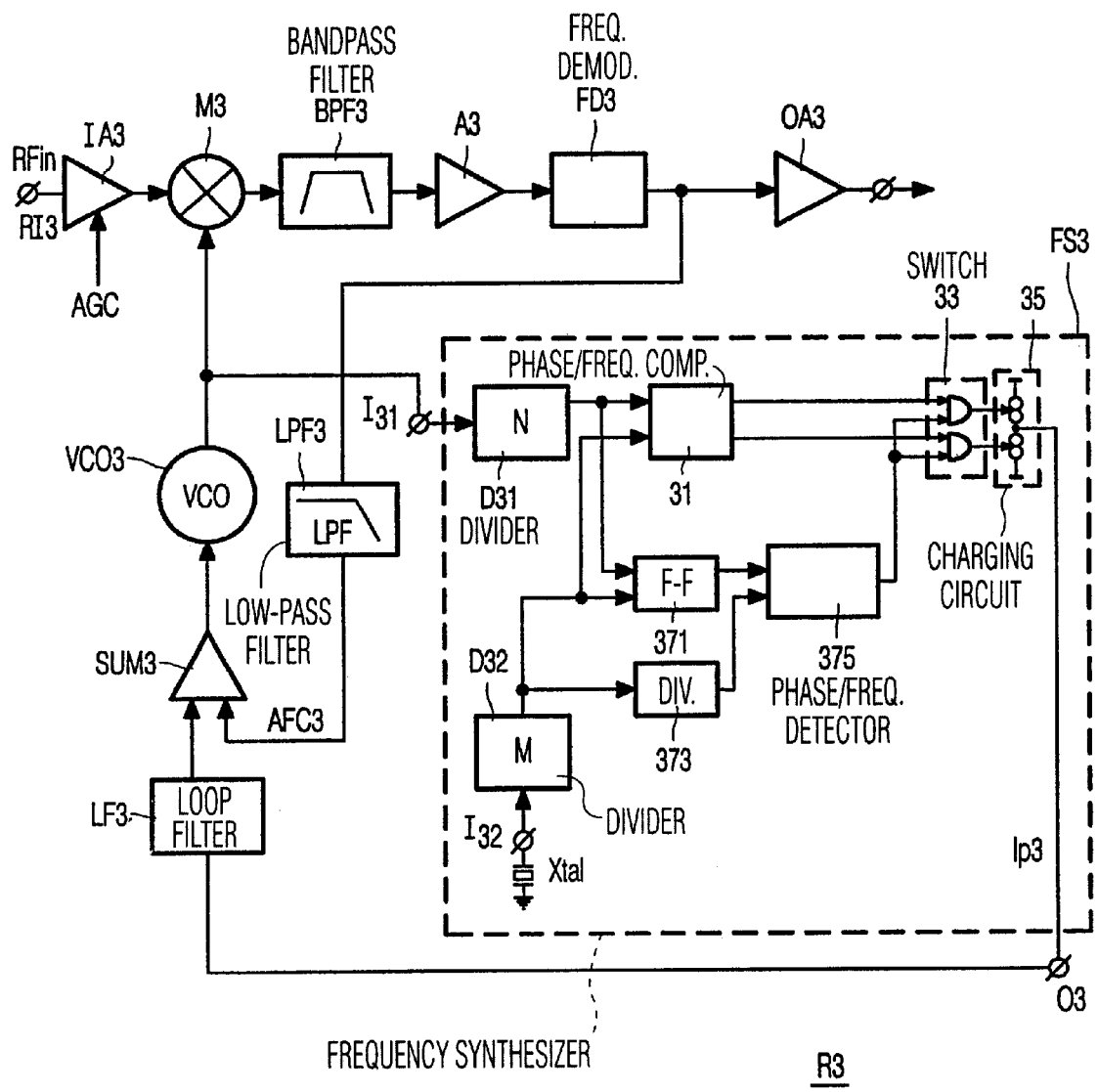
FIG. 3 shows a block schematic example of a receiver comprising a frequency synthesizer according to the invention.

FIG. 3 shows an example of a receiver R3 having a frequency synthesizer FS3 according to the invention. At a receiver input RI3, the receiver receives a RF signal Rfin. This signal is supplied to an input amplifier IA3, this amplifier also receiving an automatic gain control signal AGC. The output signal of the input amplifier IA3 is supplied to a mixer M3. At its other input, the mixer receives a signal from a voltage-controlled oscillator VCO3. The output of the-mixer is supplied, via a bandpass filter, BPF3, to a further amplifier A3, a frequency demodulator FD3 and an output amplifier OA3, to supply a baseband output signal for further processing. This is well known in the art, and needs no further explanation.

The input signal of the output amplifier OA3 is also supplied, via a low-pass filter LPF3, as an automatic frequency control signal AFC3 to an input of a summing device SUM3. The summing device receives, at its other input, via a loop filter LF3, the output signal lp3 from the frequency synthesizer FS3.

The frequency synthesizer FS3 has, in this example, the same structure as in FIG. 2; all elements have corresponding reference numerals.

This receiver structure, with the combined tuning system, enables the use of cheap crystal oscillators because when the voltage-controlled oscillator is "in-window", the frequency synthesizer is disabled. Therefore, the accuracy of the VCO frequency is not dependent on the accuracy of the crystal frequency, but on the AFC signal. Another advantage is that the AFC has taken over control of the VCO, saving a substantial amount of power dissipation if the frequency synthesizer is turned off.

Figure 4:
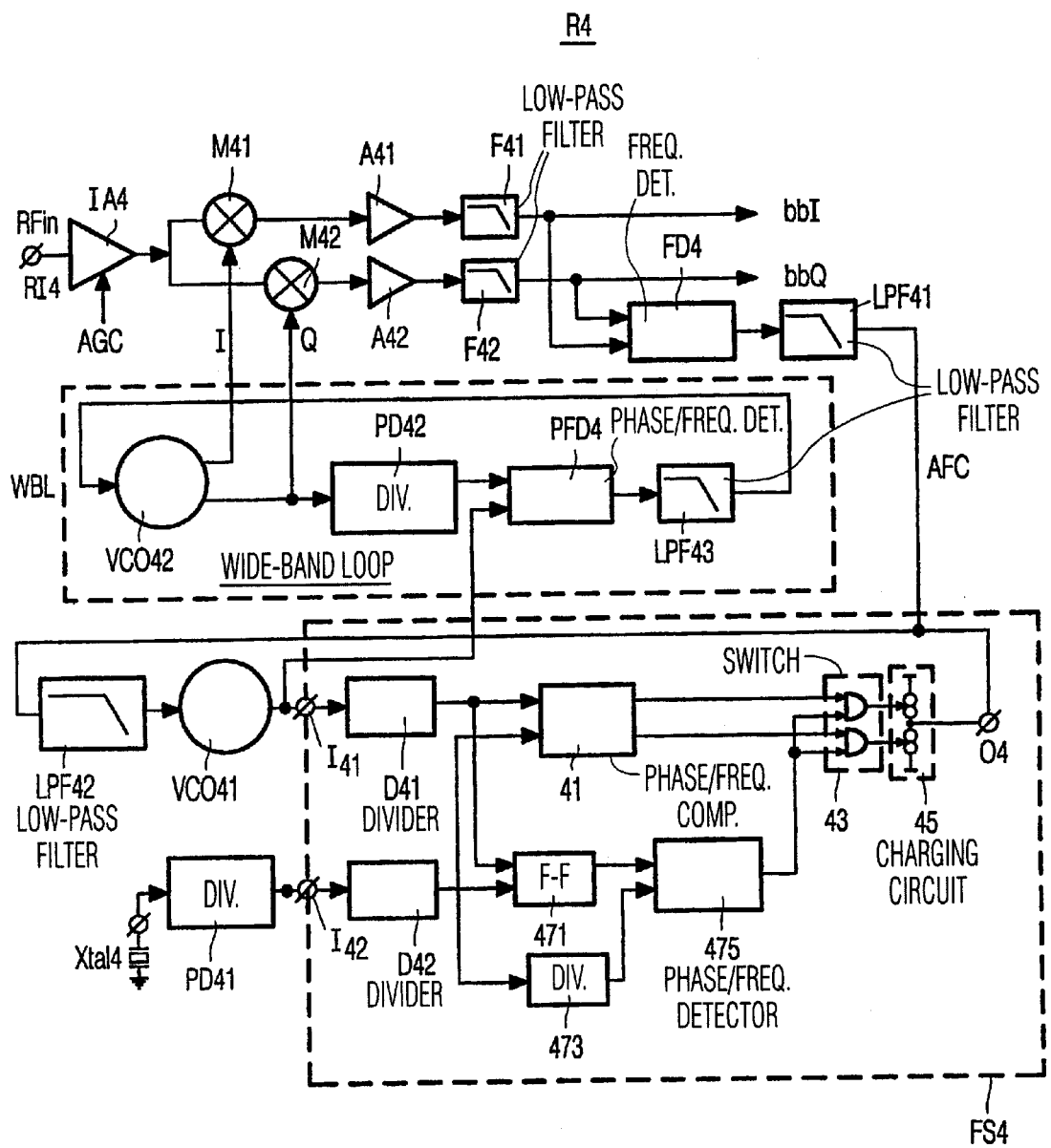
FIG. 4 shows a block schematic example of a receiver comprising a frequency synthesizer according to the invention.

FIG. 4 shows an example of a digital satellite receiver R4. At an input R14, the receiver receives the RF signal RFin. This signal is supplied to an input amplifier IA4 controlled with an automatic gain control signal AGC. The output signal of the input amplifier IA4 is supplied to a first mixer M41 and to a second mixer M42. The first mixer M41 receives an I -signal at its other input, and supplies, via an amplifier A41 and a low-pass filter F41, a baseband I-signal bbI. The second mixer M42 receives, at its second input, a Q-signal and supplies, via an amplifier A42 and a low-pass filter F42, a baseband Q-signal bbQ. This is generally known in the art and needs no further explanation.

The baseband I-signal and the baseband Q-signal are also supplied to a frequency detector FD4. The output of the frequency detector FD4 is coupled to a low-pass filter LPF41, supplying an analog automatic frequency control signal AFC. This automatic frequency control signal-is supplied, via a low-pass filter LPF42, to a low-noise voltage-controlled oscillator VCO41. The output of the voltage-controlled oscillator VCO41 is supplied to the input I41 of the frequency synthesizer FS4. At an input I42, the frequency synthesizer receives the frequency signal from a crystal oscillator Xtal4 via a programmable divider PD41. The output O4 of the frequency synthesizer is coupled to the input of the low-pass filter LPF42.

A voltage-controlled oscillator VCO42 supplies the I-signal and the Q-signal to the first mixer M41 and the second mixer M42, respectively. The Q-signal is also supplied to a programmable divider PD42. The output of the programmable divider PD42 is supplied to a phase-frequency detector PFD4. The other input of the phase-frequency detector PFD4 receives the output signal of the voltage-controlled oscillator VCO41. The output of the phase-frequency detector is supplied, via a low-pass filter LPF43, to the input of the voltage-controlled oscillator VCO42. In this way, a wide-band loop WBL is created, reducing phase noise of the integrated quadrature oscillator VCO42. The use of the AFC function enables frequency drifts of the Low Noise Block (LNB) converter (not shown) to be compensated in a smooth and continuous way avoiding cycle slips. In a standard way, the division ratio of the divider D41 has to be switched (discontinuous), The frequency synthesizer FS4 has, in this example, the same structure as in FIG. 2 and needs here no further explanation.

Figure 5:
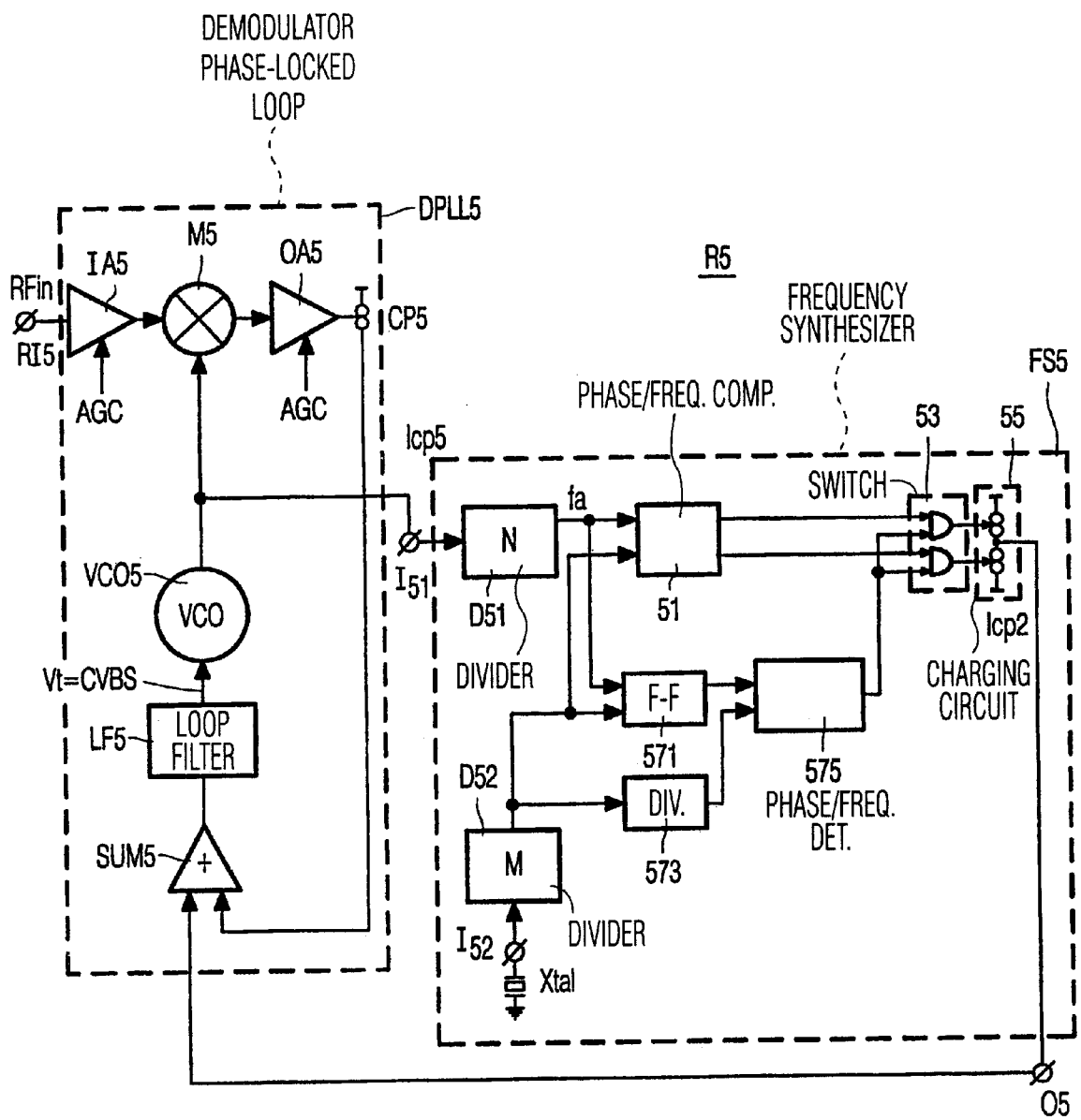
FIG. 5 shows a block schematic example of a receiver comprising a frequency synthesizer according to the invention.

FIG. 5 shows an example of a receiver R5 comprising a demodulator phase-locked loop DPLL5 and a frequency synthesizer FS5 for use in a direct conversion analog satellite receiver. This figure shows an example of a direct conversion analog satellite receiver. At an input RI5, the receiver receives an RF input signal RFin. The input RI5 is coupled to an input amplifier IA5 controlled by an automatic gain control AGC. The output of the input amplifier IA5 is coupled to a mixer MS for mixing this signal with a signal from a voltage-controlled oscillator VCO5. The output of the mixer M5 is coupled, via an output amplifier OA5, also controlled by automatic gain control AGC, to charging means CP5. The charging AD means CP5 is coupled to an input of summing means SUM5 for supplying a current Icp5. At its other input, the summing means SUM5 receives the output signal from the frequency synthesizer FS5. The output of the summing means SUM5 is coupled, via a loop filter LF5, to the input of the voltage-controlled oscillator VCO5. The frequency synthesizer FS5 corresponds with earlier described examples. Because of the switching means of the frequency synthesizer according to the invention, a direct conversion is possible.

Figure 6:
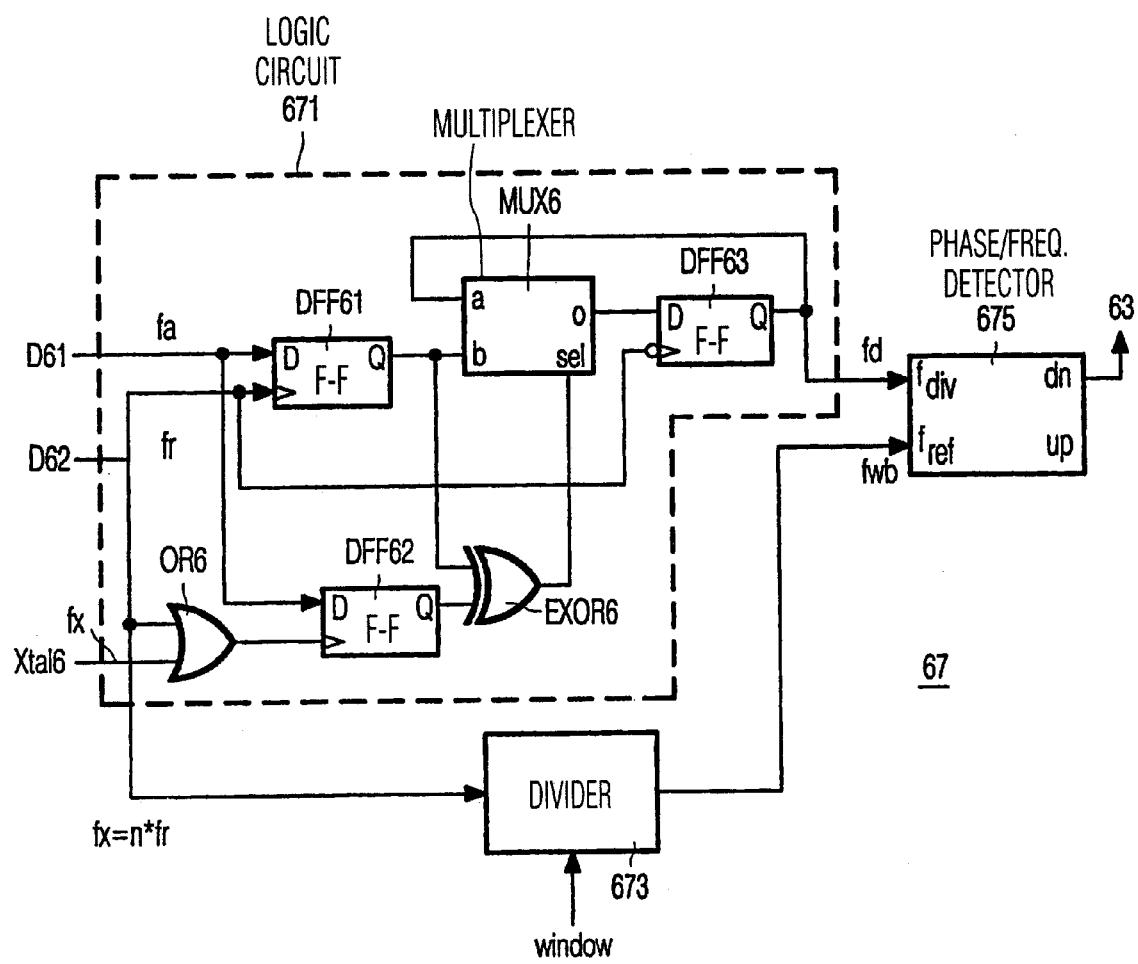
FIG. 6 shows a block schematic example of a frequency window detector according to the invention.

FIG. 6 shows an example of a frequency window detector 67, wherein the D-Flip-Flop 571 (see FIG. 5) has been replaced by a logic circuit 671 comprising three D-Flip-Flops DFF61, DFF62, and DFF63, a multiplexer MUX6, an OR-gate OR6 and an EXOR-gate EXOR6.

The signal fa from the divider D61 is supplied to a first input of D-Flip-Flop DFF61, and the signal from the divider D62 is supplied to the other input of DFF61. In FIG. 5, the output of this D-Flip-Flop (571, in FIG. 5) is supplied to the phase-frequency detector 675 (575 in FIG. 5). Here, the output signal of D-Flip-Flop DFF61 is supplied to the multiplexer MUX6. The output signal of the multiplexer is supplied to the D-Flip-Flop DFF63, which receives, at its other input, the signal fr from the divider D62. The output signal of D-Flip-flop DFF63 is supplied to the phase-frequency detector 675, and is also coupled back to the other input of the multiplexer MUX6. The multiplexer further has a select input which receives a signal from the EXOR-gate EXOR6.

The clock signal fx from the crystal oscillator Xtal6 is supplied to an input of the OR-gate OR6. At its other input, the OR-gate OR6 receives the signal fr from the divider D62. The output of the OR-gate OR6 is supplied to the D-Flip-Flop DFF62. At the D-input, this D-Flip-Flop receives the signal fa from the divider D61.

The output signal of the D-Flip-Flop DFF62 is supplied to the other input of the, EXOR-gate EXOR6.

By replacing the D-Flip-Flop (571, FIG. 5) by the logic circuit 671, the detection of 'out of window' is further improved. To detect (extra) transitions of the signal fa which lie within a given distance from the sampling moment which could cause 'wrong' decisions, these transitions are then disregarded.

The safety window is achieved by use of the D-Flip-Flop DFF62, that is sampling the signal fa with a higher frequency fx. The OR-gate OR6 lets D-Flip-Flop DFF62 be clocked by signal fx when signal fr is low. The rising edge of the signal fr not only clocks the D-Flip-Flop-DFF61, sampling fa, but also freezes the state of the D-Flip-Flop-DFF62. To assess a 'dangerous' transition in the signal fa, the output of the D-Flip-Flops DFF61 and DFF62 are combined in the EXOR-gate EXOR6. If the states of the two D-Flip-Flops DFF61 and DFF62 are not the same, it means that a transition in the signal fa happened in between the sampling moments of the D-Flip-Flops DFF61 and DFF62. This makes the output of the EXOR-gate EXOR6 a high signal, which, in turn, forces the multiplexer MUXG to redirect the output of the D-Flip-Flop DFF63 to its input, in this way disregarding the transition in the signal fa. For example, when the output of the EXOR-gate is low, the signal at input b is supplied to the output, and when the output of the EXOR-gate is high, the signal at the input a is supplied to the output. The D-Flip-Flop DFF63 is then clocked on the falling edge of the signal fr. For proper operation, it is preferred that the signal fx has to have its rising edge before the rising edge of the signal fr.

It is to be noted that above the invention has been described on the basis of some examples. The person skilled in the art will be well aware of a lot of variations, which fall within the scope of the present invention.

For example, the frequency window detector can be amended, as will be known to the person skilled in the art, using the same idea to create the required window.

Further, the frequency synthesizer, according to the invention, can be used, for example, in all kind of receivers, pagers, and mobile phones.

What is claimed is:

1. A frequency synthesizer comprising:
    a first input for receiving a first frequency signal and a second input for receiving a second frequency signal;
    a comparator coupled to the first and second inputs for comparing the first and second signals;
    charging means having an input coupled to an output of said comparator and an output coupled to an output of the frequency synthesizer for supplying an output signal;
    a frequency window detector also coupled to the first and second inputs, said frequency window detector supplying an output signal depending on whether or not the first and second frequency signals are within a predetermined frequency window; and
    switching means coupled between the comparator and the charging means, said switching means being controlled by the output signal of the frequency window detector
    wherein the frequency window detector comprises:
        a logic circuit having inputs coupled, respectively, to the first and the second inputs of the frequency synthesizer, and an output;
        a phase-frequency detector for supplying a frequency difference signal, said phase-frequency detector having a first input coupled to the output of the logic circuit, a second input, and an output; and
        a programmable divider having an input coupled to the second input of the frequency synthesizer, and an output coupled to the second input of the phase-frequency detector, said phase-frequency detector supplying an output signal depending on a frequency difference between the first and second frequency signals as a control signal to the switching means, characterized in that the logic circuit comprises:
            a first D-Flip-Flop having inputs coupled, respectively, to the first and second inputs of the frequency synthesizer, and an output;
            a multiplexer having a first input coupled to the output of the first D-Flip-Flop, a second input, a select input, and an output;
            a second D-Flip-Flop having a first input coupled to the first input of the frequency synthesizer, a second input, and an output;
            an OR-gate having a first input coupled to the second input of the frequency synthesizer, a second input coupled to receive a clock signal, and an output coupled to the second input of the second D-Flip-Flop;
            an EXOR-gate having a first input coupled to the output of the second D-Flip-Flop, a second input coupled to the output of the first D-Flip-Flop, and an output coupled to the select input of the multiplexer; and
            a third D-Flip-Flop having a first input coupled to the output of the multiplexer, a second input coupled to the second input of the frequency synthesizer, and an output coupled to the second input of the multiplexer and to the phase-frequency detector.

2. A receiver for receiving a RF signal, said receiver comprising:
    a first and a second mixer for mixing an input signal to form a baseband I signal and a baseband Q signal, respectively; and
    a wide-band loop comprising a first voltage-controlled oscillator for supplying an I signal and a Q signal to the first and second mixers, respectively, characterized in that the receiver further comprises:
        a second voltage-controlled oscillator; and
        a frequency synthesizer coupled to the second voltage-controlled oscillator,
        wherein said frequency synthesizer comprises:
            a first input for receiving a first frequency signal and a second input for receiving a second frequency signal;
            a comparator coupled to the first and second inputs for comparing the first and second signals;
            charging means having an input coupled to an output of said comparator and an output coupled to an output of the frequency synthesizer for supplying an output signal;
            a frequency window detector also coupled to the first and second inputs, said frequency window detector supplying an output signal depending on whether or not the first and second frequency signals are within a predetermined frequency window; and
            switching means coupled between the comparator and the charging means, said switching means being controlled by the output signal of the frequency window detector.

* * * * *